United States Patent
Sung-Spitzl

(10) Patent No.: US 6,543,380 B1
(45) Date of Patent: Apr. 8, 2003

(54) DEVICE FOR THE PRODUCTION OF HOMOGENOUS MICROWAVE PLASMA

(76) Inventor: Hildegard Sung-Spitzl, Niederscheuren 27 A, Konigswinter D-53639 (DE)

( * ) Notice: Subject to any disclaimer, the term of this patent is extended or adjusted under 35 U.S.C. 154(b) by 0 days.

(21) Appl. No.: 09/446,569
(22) PCT Filed: May 16, 1998
(86) PCT No.: PCT/EP98/02897
§ 371 (c)(1), (2), (4) Date: Feb. 1, 2000
(87) PCT Pub. No.: WO98/59359
PCT Pub. Date: Dec. 30, 1998

(30) Foreign Application Priority Data

Jun. 23, 1997 (DE) ......................................... 197 26 663

(51) Int. Cl.$^7$ ........................................... C23C 16/511
(52) U.S. Cl. ......................... 118/723 MW; 156/345.41; 118/718
(58) Field of Search ................. 118/723 MR, 723 MA, 118/723 MW, 723 MP, 725, 723 E, 719, 722, 723 AN, 723 FI, 723 I, 724; 156/345; 204/192.32, 168, 298.16, 298.2, 298.34, 298.37; 216/67, 70; 219/121.4, 121.41, 121.43, 121.52

(56) References Cited

U.S. PATENT DOCUMENTS

| | | | | |
|---|---|---|---|---|
| 3,373,357 A | * | 3/1968 | Keenan et al. ............... | 324/645 |
| 4,795,113 A | * | 1/1989 | Minovitch .................... | 244/63 |
| 5,015,349 A | * | 5/1991 | Suib et al. ................... | 204/168 |
| 5,131,993 A | * | 7/1992 | Suib et al. ................... | 204/168 |
| 5,466,295 A | * | 11/1995 | Getty ................. | 118/723 MA |
| 5,611,864 A | * | 3/1997 | Kimura et al. ....... | 118/723 MR |
| 5,629,054 A | * | 5/1997 | Kanai ................. | 118/723 MW |
| 5,838,108 A | * | 11/1998 | Frank et al. .................... | 315/39 |
| 6,044,661 A | * | 4/2000 | Pfister et al. ................... | 62/480 |
| 6,096,389 A | * | 8/2000 | Kanai ........................... | 427/575 |
| 6,175,183 B1 | * | 1/2001 | Liehr ..................... | 313/231.31 |
| 6,242,053 B1 | * | 6/2001 | Anderie et al. ............. | 427/488 |

FOREIGN PATENT DOCUMENTS

| | | |
|---|---|---|
| DE | 19608949 A | 9/1997 |
| EP | 0 335 675 A | 10/1989 |
| EP | 0 564 359 A | 10/1993 |
| JP | 56 136646 A | 10/1981 |
| WO | WO 9621751 | 7/1996 |

OTHER PUBLICATIONS

B.E. Gilchrist et al, "Flexible microwave system to measure the electron number density and quantify the communications impact of electric thruster plasma plumes", Rev. Sci. Instrum. 68 (2), Feb. 1997, pp. 1189–1194.*

T.L. Rhodes et al, "DIII–D divertor reflectometer system", Rev. Sci. Instrum. 68 (1), Jan. 1997, pp. 447–449.*

P.J.Matsuo et al, "Roles of N2 addition on CF4/O2 remote plasma chemical dry etching of polycrystalline silicon", J. Vac. Sci. Technol. A 15(4), Jul./Aug. 1997, pp. 1801–1813.*

* cited by examiner

Primary Examiner—Jeffrie R. Lund
Assistant Examiner—Rudy Zervigon
(74) Attorney, Agent, or Firm—D. Peter Hochberg; Katherine R. Vieyra; Sean Mellino

(57) ABSTRACT

A device for generating microwave plasmas and having a microwave generator, a chamber feeding microwaves, and a plasma chamber with receptacles, if appropriate, is proposed, the chamber being of cylindrical construction. The plasma chamber preferably comprises the cylindrical chamber completely or partially. Coupling points are arranged in the common wall, preferably as slot couplers.

20 Claims, 6 Drawing Sheets

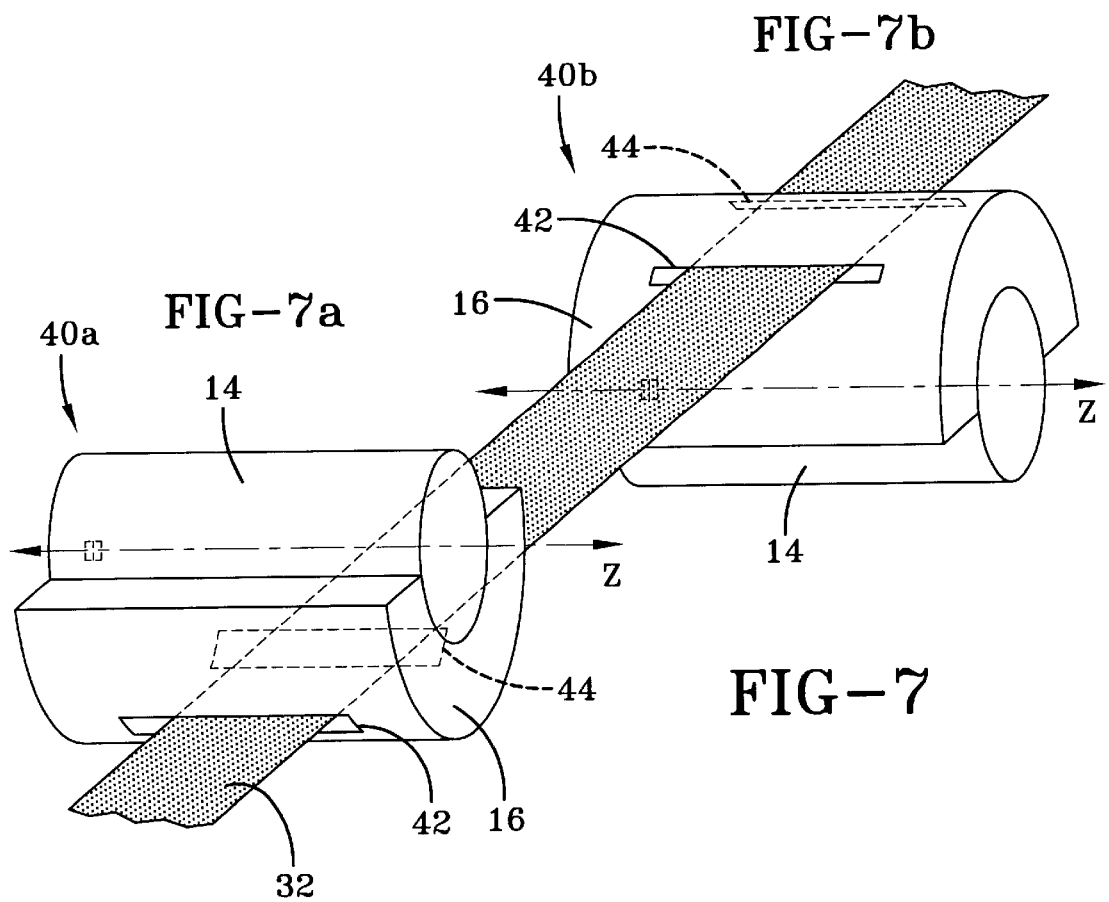
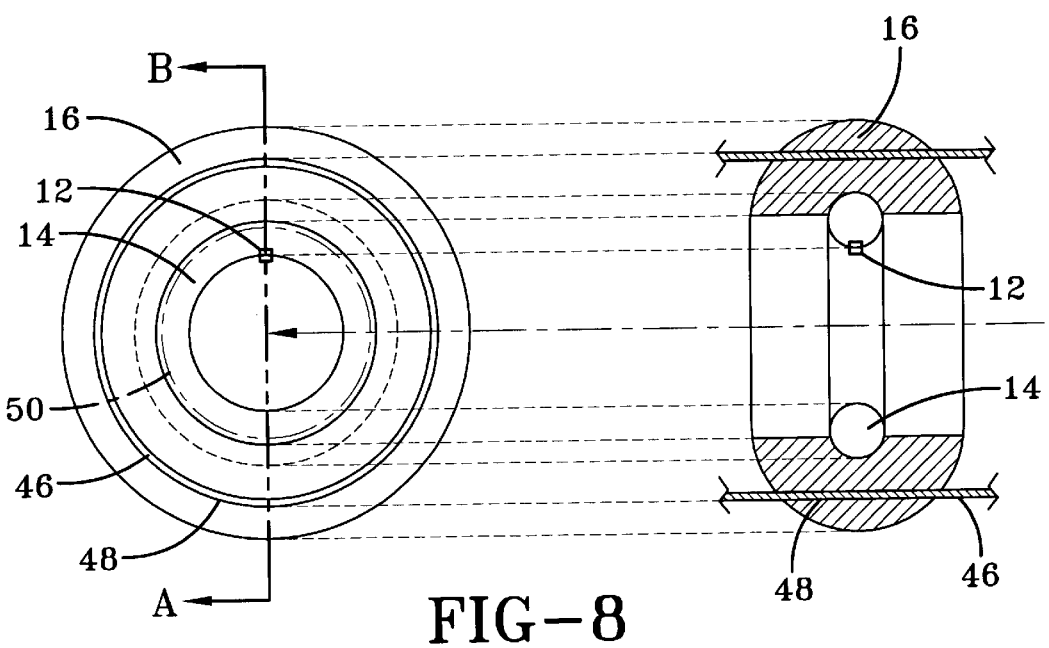

DEVICE FOR THE PRODUCTION OF HOMOGENOUS MICROWAVE PLASMA

BACKGROUND OF THE INVENTION

1. Field of the Invention

The present invention relates to the production of a homogenous plasma. More specifically, the present invention relates to a device that uses microwaves for the production of homogenous plasma.

2. Description of the Prior Art

Various types of plasmas are generated using a wide variety of methods and devices. Plasma treatment is used, for example, for coating, cleaning, modifying and etching substrates, for treating medical implants, for inverting gases and in technology for purifying waste gases. The geometry of the workpieces to be treated ranges from flat substrates, fibers and webs, to any configuration of shaped articles. The size of the plasma chamber, and thus of the workpieces is limited. Materials in web form and fiber bundles can be processed only with difficulty.

Known devices have, for example, outer rings which can be constructed as a resonator. To feed the microwaves, use is made, inter alia, of waveguides and coaxial cables and, inter alia, of antennas, for example slots, as coupling points in the wall of the plasma chamber.

A disadvantage of the known devices are the formations of inhomogeneities in the in the plasma, particularly at high pressures and in relatively large plasma chambers and/or substrates.

The task therefore existed of generating a homogenous plasma and rendering possible homogenous plasma treatment.

SUMMARY OF THE INVENTION

It is proposed according to the invention to introduce the microwaves homogenously into the plasma chamber serving the purpose of processing via a cylindrical chamber and via coupling points in the cylindrical wall of this chamber. The plasma chamber is then to be constructed on the outside completely or partially covering the cylindrical wall of the chamber.

BRIEF DESCRIPTION OF THE DRAWINGS

FIG. 7 is a perspective view of two devices arranged in sequential order for treating a web-shaped substrate.

FIG. 8 is a cross section of a perspective view of a device for the continuous processing of tubes which are guided continuously through the plasma chamber.

DETAILED DESCRIPTION OF THE INVENTION

Figure 1:
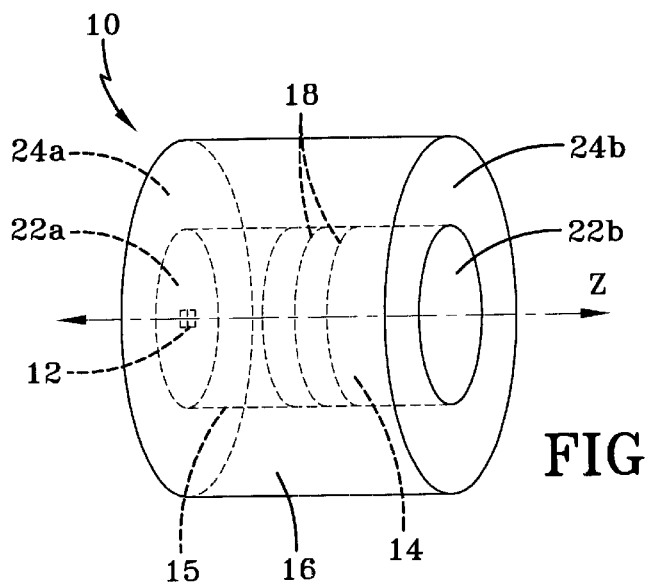
FIG. 1 is a perspective view of a device for the production of homogenous microwave plasma.

Referring now to the drawings, the subject matter of the present invention, as shown in FIG. 1, is a device for generating microwave plasmas and referred to generally at numeral 10. Device 10 comprises a microwave generator 12, a feeding chamber 14, a plasma chamber 16, a plurality of coupling points 18 in the wall 15 between the feeding chamber 14 and plasma chamber 16, as well as, if appropriate, a plurality of receptacles 20, characterized in that the microwave feeding chamber 14 is of a cylindrical design. Device 10 further comprises feeding chamber end faces 22a, b and plasma chamber end faces 24a, b. Feeding chamber end faces 22a, b and plasma chamber end faces 24a, b lie in the same vertical plane in this case. Cylindrical feeding chamber 14 is surrounded by the plasma chamber 16 with a microwave generator 12 in one end face 22a of the feeding chamber 14.

The feeding chamber end faces 22a, b are preferably not covered by the plasma chamber 16. The plasma chamber 16 completely or partially covers the cylindrical wall of the feeding chamber 14.

The common wall 15 between the feeding chamber 14 and the plasma chamber 16 is preferably to be constructed completely, partially or substantially in a cylindrical fashion. The configuration of the outer wall 17 of the plasma chamber 16 is of cylindrical or arbitrary configuration, for example, adapted to the type of processing being used. As a resonator, the plasma chamber 16 can be constructed, for example, as a resonator of coaxial, rectangular or annular shape. As an annular resonator, the plasma chamber 16 can, given a rectangular cross section, form the common wall 15 with the feeding chamber 14 with the short or long side. The plasma chamber 16 can also be constructed as a segment of the said shapes.

The plasma chamber 16 and the cylindrically shaped feeding chamber 14 preferably have a common preferred direction and, in the simplest, much preferred case, a common z-axis. It is also preferred for the feeding chamber 14 to be of a rotational symmetrical construction, at least in parts, particularly the parts near the feeding chamber end faces 22a, b and plasma chamber end faces 24a, b. Two tubes arranged inside one another and having a common z-axis are structurally the simplest, surprising and much preferred arrangement of the feeding chamber 14 and plasma chamber 16.

The feeding chamber 14 and plasma chamber 16 can be constructed with the same or different lengths along the preferred direction or axis.

The cylindrical shape and the simple geometrical configuration of the feeding chamber 14 permits improved uniformity of the microwave launching and simple construction of the feeding chamber 14 and plasma chamber 16 as resonators. The cylindrical shape of the feeding chamber 14 also permits a previously impossible variation, variability and adjustability of the configuration and effectiveness of the feeding chamber 14 and also of the plasma chamber 16. For this purpose, at least one of the feeding chamber end faces 22a, b can be arranged moveably and/or displaceably. Furthermore, at least one of the plasma chamber end faces 24a, b can be arranged moveably and/or displaceably. Displacement in the preferred direction and/or rotation of the feeding chamber end faces 22a, b and plasma chamber end faces 24a, b is possible in a particularly simple way. For this purpose, the feeding chamber end faces 22a, b and plasma chamber end faces 24a, b have exciting holders, tube stubs or the like at the cylinder wall 17. The tube stubs can have cutouts and be constructed over small or substantial parts of the cylinder wall 17 in a fashion bearing against the cylinder wall 17. The coupling points 18 can then be arranged variably, moveably and settably and be configured so that they can be covered or be switched in by opening. The cylinder wall 17 is then thereby completely or partially of two-fold or three-fold structure.

Moveable coupling points 18 can be arranged moveably with the aid of the feeding chamber end faces 22a, b and plasma chamber end faces 24a, b or by means of handles, for example, independently of the feeding chamber end faces 22a, b and plasma chamber end faces 24a, b. In many cases, the feeding chamber 14 preferably has an ideal or substantially cylindrical shape and azimuthal slots, for example, as coupling points 18. In other words, azimuthal slots, as referenced at numeral 26 in FIGS. 2a–2f, are just one specific example of coupling points 18. The feeding chamber end faces 22a, b and plasma chamber end faces 24a, b are then circular, or the contact surface with the cylinder wall is a circle and the slots, which can be switched in and out, can be moved through the feeding chamber end faces 22a, b and plasma chamber end faces 24a, b and/or from the outside.

The feeding chamber 14 can also deviate from the ideal shape of a cylinder, For example, feeding chamber 14 can have an elliptical or angular cross section or even a triangular to hexagonal cross section, completely or partially. A shape curing around the z-direction is also possible. The cylinder of the feeding chamber 14 can be curved. The feeding chamber end faces 22a, b and plasma chamber end faces 24a, b can touch one another or be eliminated and the feeding chamber 14 can have an annularly closed structure. The shape of the feeding chamber 14 stretched linearly along the z-direction is much preferred.

The plasma chamber 16 can have a feed for gases and a device for the evacuation of gases. The device of the invention can be used in a versatile fashion, but the treatment of materials in web form and of virtually arbitrary width is possible, in particular.

In order to generate a vacuum, plasma chamber 16 can include a receptacle 20 which consists completely or partially of a dielectric material with preferably low dielectric losses, for example silica glass or aluminum oxide ceramic. In the case of the construction of plasma chamber 16 as a coaxial resonator, receptacle 20 (FIGS. 10 and 11) can be designed with the aid of a dielectric tube 21 (FIGS. 10 and 11), for example made from silica glass, which is pushed over the cylinder resonator. In this case, dielectric tube 21 forms the vacuum receptacle 20 together with the outer conductor of the coaxial resonator and the feeding chamber end faces 22a, b thereof. In the case when the device is operated at higher pressures, for example atmosphere, the receptacle 20 prevents the formation of a plasma at the coupling points 18a, b and/or in the feeding cylindrical chamber 14, the supply lead thereof, or else on the microwave generator 12 itself However, by introducing dielectric material (i.e., dielectric tube 21), the plasma region of the device can likewise be specifically limited to the desired regions. Thus, for example, by cladding the region around the coupling point and the coupling points 18a, b themselves with dielectric material, it is possible to prevent the production of a plasma in this region.

If [the] plasma chamber 16 is designed as a coaxial resonator, it is preferably constructed as a TEM resonator. However, other modes such as, for example, TE modes or TM modes are also possible. In a case of treatment of materials in web form, such as, for example, plastic or material webs, the material to be treated can be fed and/or removed through slots in the outer conductor of the TEM coaxial resonator, for example along the z-axis, without being coupled outwards owing to this microwave power. Designing the cylindrical plasma chamber 16 to be fed as a $TM_{010}$ resonator with azimuthal slot couplers 66 (FIG. 9) is preferred in this case. It is preferred that the spacing of the slot couplers 66 (FIG. 9) in the z-direction is in this case a wavelength of the microwave used. Likewise possible are a plurality of slots 66 (FIG. 9) which are distributed around the circumference of the cylinder resonator and tilted out of the azimuthal direction in the direction of the z-axis by, for example, 45 degrees. It is also possible in this case to design an arrangement of rows of slots 66 (FIG. 9) at a spacing or half the wavelength, in which case the tilting direction of the slots 66 (FIG. 9) should be opposite from one row of slots to the next.

It is also possible to construct the plasma chamber 16 as a feeding chamber and the feeding chamber 14 as a plasma chamber.

Moveable coupling points 18a, b and/or feeding chamber end faces 22a, b lead, if appropriate, to assigning the function of conduction to the outer plasma chamber 16 and the function of the plasma chamber 16 to the inner feeding chamber 14.

Launching the microwaves into the plasma source can be performed using the known tuneable supply leads via a wall of the chambers; preferably via an end wall or chamber wall, the tuning of the plasma source being performed completely or partially by setting in and through a chamber wall. The tuning can also be performed via the known tuning elements.

All the parts of the devices can be present in multiple fashion.

Figure 2A:
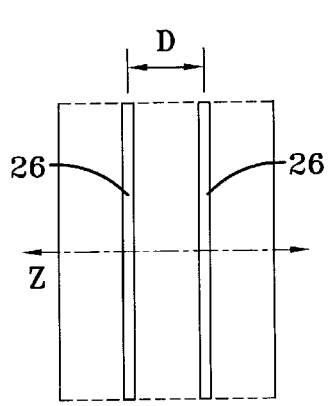
FIG. 2a is a lateral view of the developments of the lateral surfaces of the cylindrical chamber of the device as shown in FIG. 1 showing coupling points in the wall with the plasma chamber.
Figure 2B:
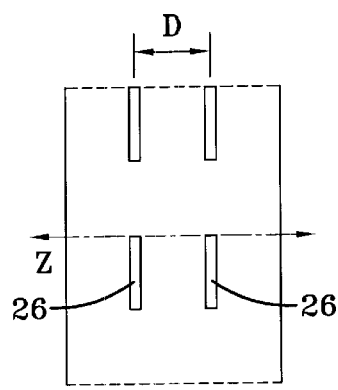
FIG. 2b is a lateral view of the developments of the lateral surfaces of the cylindrical chamber of the device as shown in FIG. 1 showing azimuthal slot couplers with a spacing of equal phase.
Figure 2C:
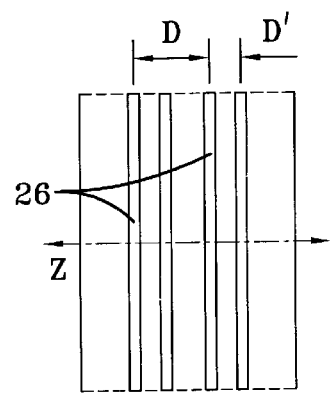
FIG. 2c is a lateral view of the developments of the lateral surfaces of the cylindrical chamber of the device as shown in FIG. 1 showing two pairs of azimuthal slot couplers with a spacing which are displaced relative to one another.
Figure 2D:
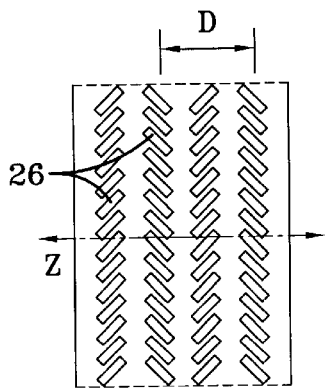
FIG. 2d is a lateral view of the developments of the lateral surfaces of the cylindrical chamber of the device as shown in FIG. 1 showing two pails of rows of slot couplers having opposing directions of tilt.

Turning now to FIGS. 2a–2f, the developments of the lateral surfaces of the cylindrical feeding chamber 14 with coupling points 18 in the wall with the plasma chamber 16 are shown. FIG. 2a shows a plurality of coupling points 18 in a more specific form of azimuthally circulating slot couplers 26 with a spacing D of preferably one or half a wavelength at resonance. FIG. 2b shows a plurality of azimuthal slot couplers 26 with a spacing D of equal phase, which cover the circumference of the cylindrical surface only partially. FIG. 2c shows two pain of azimuthal slot couplers 26 with a spacing D which are displaced relative to one another by D' of, for example, a quarter wavelength. By mechanically displacing the feeding chamber end faces 22a, b and/or the plasma chamber end faces 24a, b by D' in the direction of the z-axis, coupling is produced by both or only one pair of slots 26, The slots 26 need not also be displaced. In the case of only one slot row, feeding chamber end faces 22a, b, plasma chamber end faces 24a, b and slots 26 must be displaced in order to achieve the homogenization. A slot pair 26 is connected to the plasma chamber end face 24a, b with the aid of a holder and is displaced in the z-direction by the movement thereof. The feeding chamber end faces 22a, b are displaced until resonance is achieved. FIG. 2d shows two pairs of rows of slot couplers 26 having opposing directions of tilt with a spacing of respectively D and half of the spacing D from one another, as a result of which use is made of co-phasal launching into the plasma chamber 16. In other words, the opposite flow direction of the wall flows through opposing coupling of the rows of slots 26 at a spacing of, for example, half the resonator wavelength. Additional rows of slots 26 at a spacing of, for example, a quarter wavelength are possible. Rows of slots 26 can be displaced, as shown in FIG. 2c.

Figure 2E:
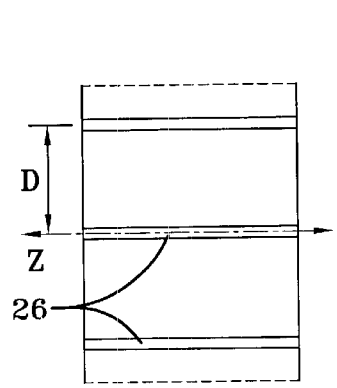
FIG. 2e is a lateral view of the developments of the lateral surfaces of the cylindrical chamber of the device as shown in FIG. 1 showing a plurality of continuous coupling slots which run parallel to the x-axis.
Figure 2F:
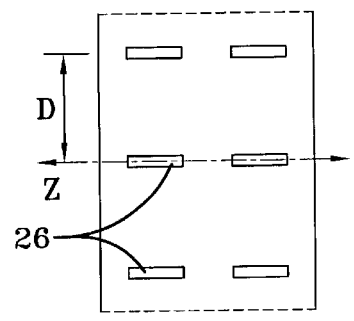
FIG. 2f is a lateral view of the developments of the lateral surfaces of the cylindrical chamber of the device as shown in FIG. 1 showing a plurality of interrupted coupling slots which run parallel to the x-axis.

FIGS. 2e and 2f show a plurality of coupling slots 26 which run parallel to the z-axis and can be changed, for example, by rotating and/or displacing the plasma chamber end face 24a, b. The slots 26 are interrupted in FIG. 2f Other coupling elements can be used instead of slots 26.

Figure 3A:
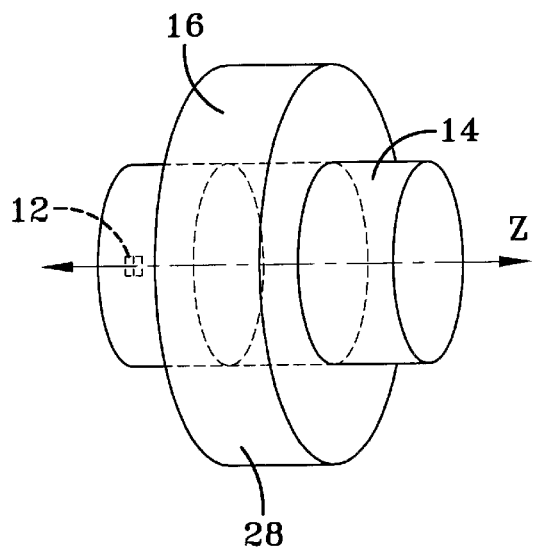
FIG. 3a is a perspective view of a device for the production of homogenous microwave plasma in the preferred construction as an annular resonator having a rectangular cross-section, wherein the microwave launching is performed via the short rectangular side.
Figure 3B:
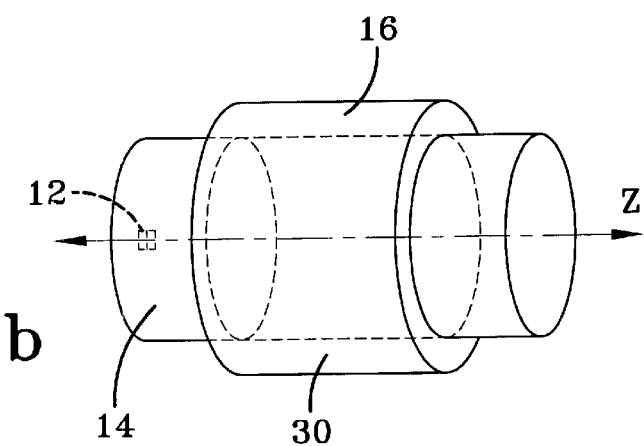
FIG. 3b is a perspective view of a device for the production of homogenous microwave plasma in the preferred construction as an annular resonator having a rectangular cross-section, wherein the microwave launching is performed via the long rectangular side.

FIG. 3 shows a device having a plasma chamber 16 in the preferred construction as an annular resonator of rectangular cross section, the microwave launching from feeding chamber 14 and being performed via a short rectangular side 28 or a long rectangular side 30.

Figure 4A:
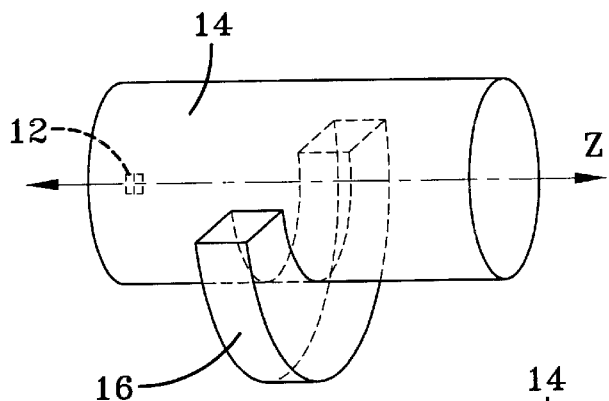
FIG. 4a is a perspective view of a device for the production of homogenous microwave plasma wherein the plasma chamber is constructed as a 180° segment of a cylinder and wherein the microwave launching is performed via the short rectangular side.
Figure 4B:
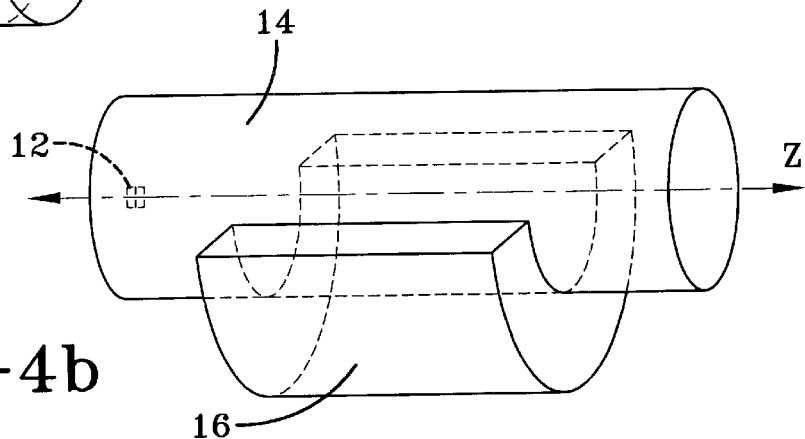
FIG. 4b is a perspective view of a device for the production of homogenous microwave plasma wherein the plasma chamber is constructed as a 180°0 segment of a cylinder and wherein the microwave launching is performed via the long rectangular side.

FIG. 4 is the same as FIG. 3, but the feeding chamber 14 is enclosed by a plasma chamber 16 which is constructed as a 180° cylinder segment.

Figure 5:
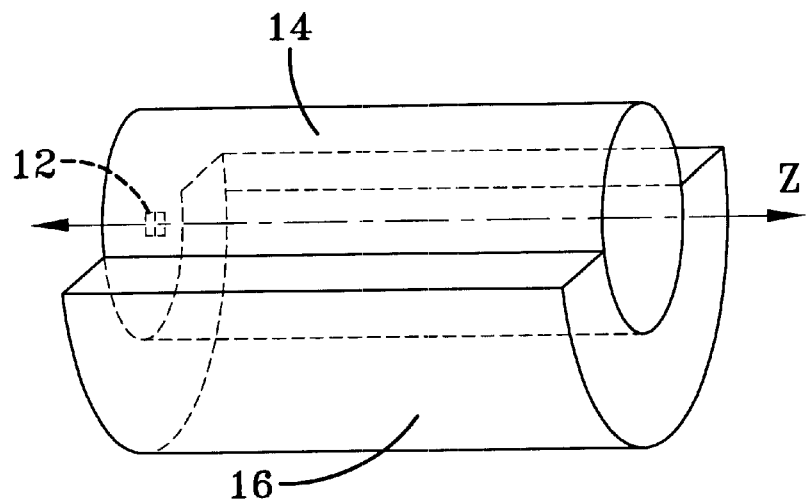
FIG. 5 is a perspective view of a device for the production of homogenous microwave plasma wherein the plasma chamber is of equal length as the feeding chamber and is constructed as a 180° segment of a cylinder.

FIG. 5 shows the feeding chamber 14, enclosed by the plasma chamber 16.

The plasma chamber 16 and feeding chamber 14 are constructed with the same length in the z-direction and are constructed as a 180° segment.

Figure 6:
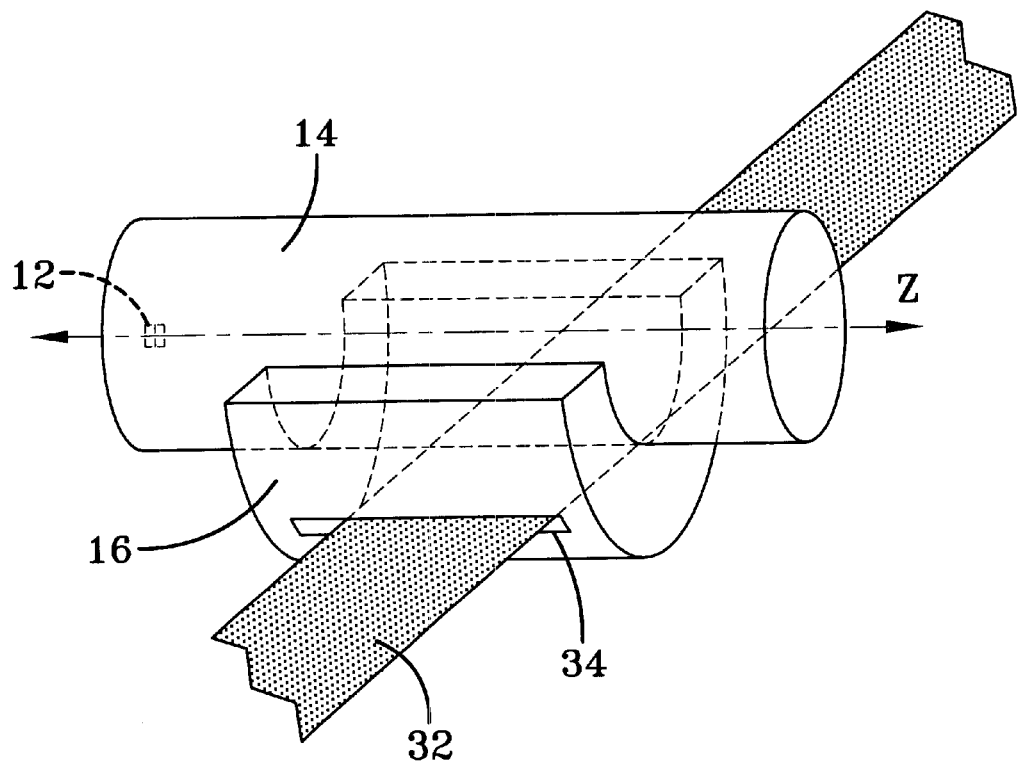
FIG. 6 is a perspective view of a device for the production of homogenous microwave plasma showing a substrate located in the plasma chamber.

FIG. 6 shows a long feeding chamber 14 enclosed by a plasma chamber 16 which is constructed to be longer than a 180° segment and through which a web-shaped substrate 32, which is to be treated, is moved continuously through the substrate entry slot 34. The substrate exit slot is not represented.

FIG. 7 shows two devices 40a, b for treating a web-shaped substrate 32 which use optionally identical or different methods, the web-shaped substrate 32 being guided sequentially through the respective substrate entry slots 42 and 44.

FIG. 8 shows a device for the continuous processing of tubes 46 which are guided continuously through a plurality of annular slots 48 of the plasma chamber 16 at tight angles to the plane of the drawing of FIG. 8a through annular slots 48. The tube 46 to be processed always has the same spacing from the coupling elements (not shown) of the annular feeding chamber 14, whose center line 50 is produced in the form of a circle by imaginary constant curvature of the cylindrical axis. In FIG. 8a, the feeding chamber 14 has a circular cross section, but it can also have a curved oval cross section or else an angular one. FIG. 8b shows a section through the devices in accordance with the line of section AB in FIG. 8a. The plasma chamber 16 is arranged as a 180° segment of a circular ring outside the ring of the feeding chamber 14, such that the outer 180° segment of the feeding chamber 14 is provided with coupling elements (not shown). The semicircle of the cross section of the plasma chamber 16 can also be constructed as a rectangle.

Figure 9:
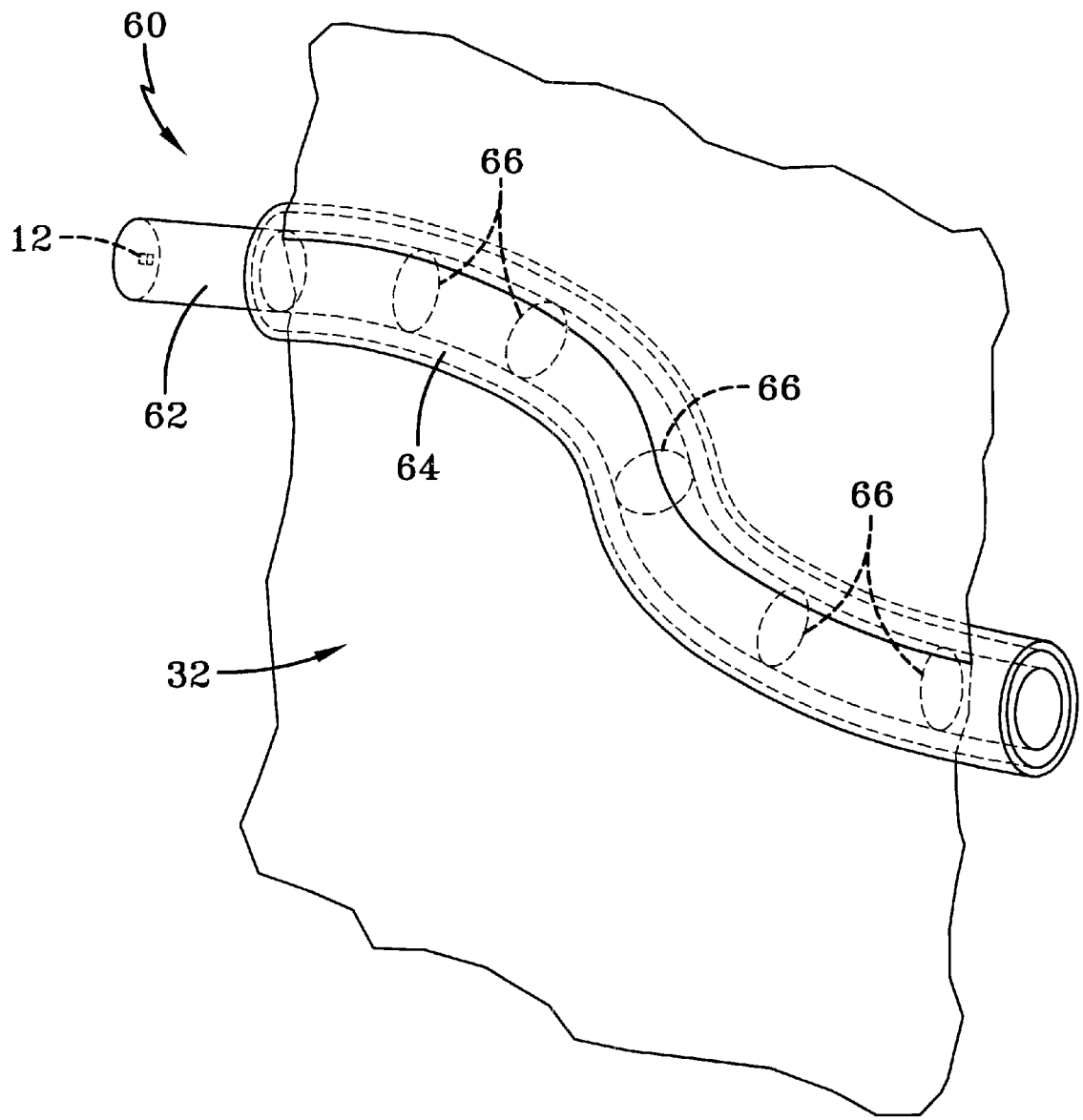
FIG. 9 is a perspective view of a device having coaxial chambers in being geometrically adapted to accommodate substrates.

FIG. 9 shows an alternative device 60 having coaxial chambers 62 and 64, which follow a curved axis (not shown) in being geometrically adapted to accommodate substrates 32. In the plane of the azimuthal slot couplers 66, the cross sections can be circular or, for example, elliptical and of constant or non-constant diameter along the curved axis.

Figure 10:
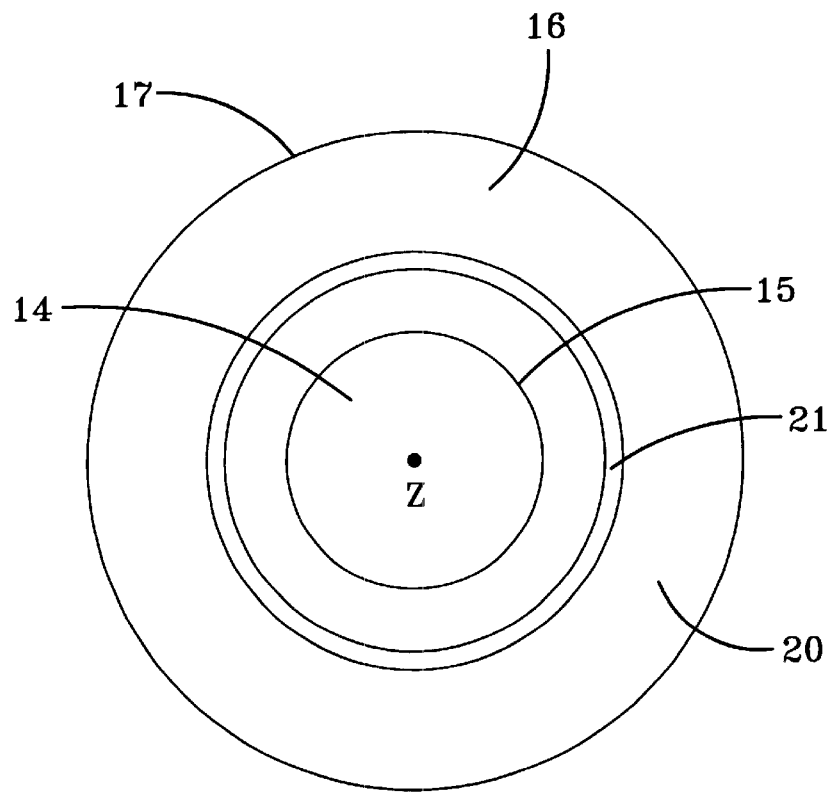
FIG. 10 is a side view of the device as shown in FIG. 1, taken along the z-axis.
Figure 11:
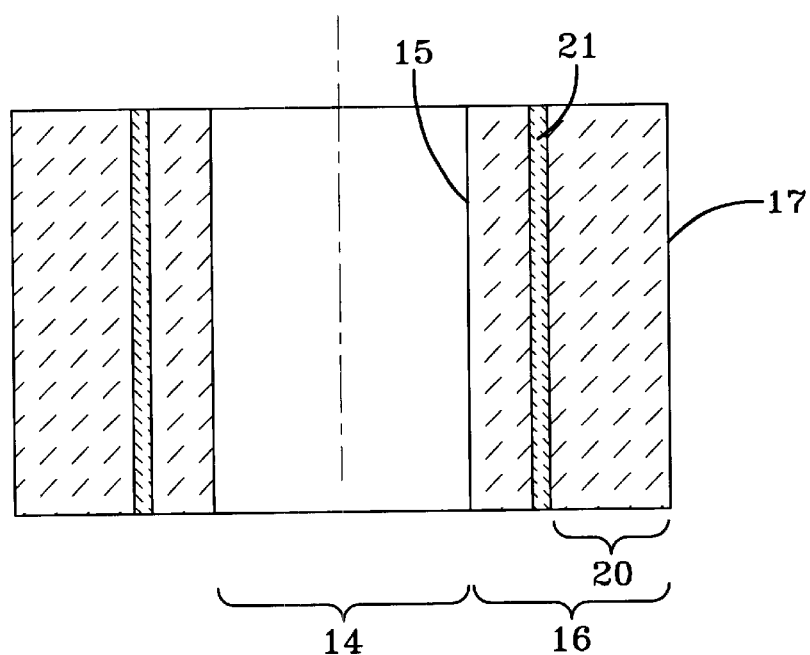
FIG. 11 is a cross section of the device as shown in FIG. 1.

FIGS. 10 and 11 show a side view and a cross-section of device 10, respectively. As explained above, in order to generate a vacuum, plasma chamber 16 can include receptacle 20 which consists completely or partially of a dielectric material with preferably low dielectric losses, for example silica glass or aluminum oxide ceramic, In the case of the construction of plasma chamber 16 as a coaxial resonator, receptacle 20 can be designed with the aid of dielectric tube 21, for example made from silica glass, which is pushed over the cylinder resonator. In this case, dielectric tube 21 forms the vacuum receptacle 20 together with the outer conductor of the coaxial resonator and the feeding chamber end faces 22a, b thereof (FIG. 1).

The invention has been described in detail, with particular emphasis having been placed on the preferred embodiments, but variations and modifications within the spirit and scope of the invention may occur to those skilled in the art to which it pertains.

What is claimed is:

1. A device for generating microwave plasmas, said device comprising:

a microwave generator;

a microwave feeding chamber of cylindrical design;

a plasma chamber;

a common wall between said feeding chamber and said plasma chamber; and a plurality of coupling points which are located within said wall and through which the microwave energy is conveyed from said feeding chamber into said plasma chamber;

wherein the plasma chamber and the feeding chamber being the same length.

2. A device for generating microwave plasmas, said device comprising:
   a microwave generator;
   a microwave feeding chamber of cylindrical design;
   a plasma chamber;
   a common wall between said feeding chamber and said plasma chamber; and
   a plurality of coupling points which are located within said wall and through which the microwave energy is conveyed from said feeding chamber into said plasma chamber;
   wherein said feeding chamber comprises end faces, and wherein at least one of said end faces is adjustable.

3. The device of claim 2 wherein said plasma chamber comprises end faces, and wherein at least one of said end faces of said plasma chamber is also adjustable.

4. The device of claim 2 wherein said end face(s) is/are adjustable by rotation.

5. The device of claim 2 wherein said end face(s) is/are adjustable by shifting along a common axis.

6. A device for generating microwave plasmas, said device comprising:
   a microwave generator;
   a microwave feeding chamber of cylindrical design;
   a plasma chamber;
   a common wall between said feeding chamber and said plasma chamber; and
   a plurality of coupling points which are located within said wall and through which the microwave energy is conveyed from said feeding chamber into said plasma chamber;
   wherein said plasma chamber comprises end faces, and wherein at least one of the end faces of the plasma chamber is adjustable.

7. The device of claim 6 wherein said end face(s) is/are adjustable by rotation.

8. The device of claim 6 wherein said end face(s) is/are adjustable by shifting along a common axis.

9. A device for generating microwave plasmas, said device comprising:
   a microwave generator;
   a microwave feeding chamber of cylindrical design;
   a plasma chamber;
   a common wall between said feeding chamber and said plasma chamber; and
   a plurality of coupling points which are located within said wall and through which the microwave energy is conveyed from said feeding chamber into said plasma chamber;
   wherein said wall is, at least in part, constructed from the group consisting of a double wall, a threefold wall and a multiple wall, and wherein the wall with the coupling points is arranged displaceably.

10. The device of claim 9 wherein the wall with coupling points is arranged rotatably.

11. A device for generating microwave plasmas, said device comprising:
    a microwave generator;
    a microwave feeding chamber of cylindrical design;
    a plasma chamber;
    a common wall between said feeding chamber and said plasma chamber; and
    a plurality of coupling points which are located within said wall and through which the microwave energy is conveyed from said feeding chamber into said plasma chamber;
    wherein said wall is, at least in part, constructed as a double, threefold or multiple wall, and wherein the wall with the coupling points is arranged rotatably.

12. A device for generating microwave plasmas, said device comprising:
    a microwave generator;
    a microwave feeding chamber of cylindrical design;
    a plasma chamber;
    a common wall between said feeding chamber and said plasma chamber; and
    a plurality of coupling points which are located within said wall and through which the microwave energy is conveyed from said feeding chamber into said plasma chamber, and wherein said coupling points are adjustable or movable.

13. The device of claim 12 wherein at least one of said chambers comprises at least one adjustable end face which is provided with means by which said coupling points can be adjusted.

14. A device for generating microwave plasmas, said device comprising:
    a microwave generator;
    a microwave feeding chamber of cylindrical design;
    a plasma chamber;
    a common wall between said feeding chamber and said plasma chamber; and
    a plurality of coupling points which are located within said wall and through which the microwave energy is conveyed from said feeding chamber into said plasma chamber;
    wherein said wall is, at least in part, constructed as a double, threefold or multiple wall, and wherein at least one of these walls is arranged displaceably.

15. A device for generating microwave plasmas, said device comprising:
    a microwave generator;
    a microwave feeding chamber of cylindrical design;
    a plasma chamber;
    a common wall between said feeding chamber and said plasma chamber; and
    a plurality of coupling points which are located within said wall and through which the microwave energy is conveyed from said feeding chamber into said plasma chamber, and wherein said wall is, at least in part, constructed as a double, threefold or multiple wall, and wherein at least one of these walls is arranged rotatably.

16. A device for generating microwave plasmas, said device comprising:
    a microwave generator;
    a microwave feeding chamber of cylindrical design;
    a plasma chamber;
    a common wall between said feeding chamber and said plasma chamber; and
    a plurality of coupling points which are located within said wall and through which the microwave energy is conveyed from said feeding chamber into said plasma chamber;
    the plasma chamber and the feeding chamber having a common direction and being the same length.

17. The device of claim 16 wherein said common direction is the direction in the z axis.

18. The device of claim 16 wherein the plasma chamber and the feeding chamber are of different lengths.

19. A device for generating microwave plasmas, said device comprising:
- a microwave generator;
- a microwave feeding chamber of cylindrical design;
- a plasma chamber;
- a common wall between said feeding chamber and said plasma chamber; and
- a plurality of coupling points which are located within said wall and through which the microwave energy is conveyed from said feeding chamber into said plasma chamber;
- the plasma chamber and the feeding chamber being the same length and wherein the plasma chamber encloses the feeding chamber.

20. A device for generating microwave plasmas, said device comprising:
- a microwave generator;
- a microwave feeding chamber of cylindrical design;
- a plasma chamber;
- a common wall between said feeding chamber and said plasma chamber; and
- a plurality of coupling points which are located within said wall and through which the microwave energy is conveyed from said feeding chamber into said plasma chamber;
- the plasma chamber and the feeding chamber being the same length, wherein said plasma chamber and said feeding chamber comprise end faces and wherein said microwave generator is arranged in or near one of said end faces or a wall of one of said chambers.

* * * * *